(12) United States Patent
Shimomura et al.

(10) Patent No.: US 10,102,894 B2
(45) Date of Patent: Oct. 16, 2018

(54) MAGNETIC MEMORY

(71) Applicant: KABUSHIKI KAISHA TOSHIBA, Minato-ku (JP)

(72) Inventors: Naoharu Shimomura, Meguro (JP); Tomoaki Inokuchi, Yokohama (JP); Hiroki Noguchi, Yokohama (JP); Katsuhiko Koui, Yokohama (JP); Yuuzo Kamiguchi, Yokohama (JP); Kazutaka Ikegami, Inagi (JP); Hiroaki Yoda, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/698,242

(22) Filed: Sep. 7, 2017

(65) Prior Publication Data
US 2018/0158499 A1    Jun. 7, 2018

(30) Foreign Application Priority Data

Dec. 2, 2016    (JP) .................................. 2016-235379

(51) Int. Cl.
*G11C 11/16*    (2006.01)
*H01L 27/22*    (2006.01)
(Continued)

(52) U.S. Cl.
CPC .......... *G11C 11/1657* (2013.01); *G11C 11/15* (2013.01); *G11C 11/161* (2013.01);
(Continued)

(58) Field of Classification Search
CPC ........................ G11C 11/161; G11C 11/1675
(Continued)

(56) References Cited

U.S. PATENT DOCUMENTS 5,745,406 A * 4/1998 Yamane .................. G11C 11/15
                                              365/158
6,128,160 A * 10/2000 Yamamoto ............. B82Y 10/00
                                              360/324.11
(Continued)

FOREIGN PATENT DOCUMENTS

JP    2007-281502    10/2007
JP    2013-243336    12/2013
(Continued)

*Primary Examiner* — Michael Tran
(74) *Attorney, Agent, or Firm* — Oblon, McClelland, Maier & Neustadt, L.L.P.

(57) ABSTRACT

A magnetic memory includes: a first and second terminals; a conductive layer including first to fourth regions, the first and fourth regions being electrically connected to the first and second terminals respectively; a first magnetoresistive element including: a first and second magnetic layers; a first nonmagnetic layer between the first and second magnetic layers; and a third terminal electrically connected to the first magnetic layer; a second magnetoresistive element including: a third and fourth magnetic layers; a second nonmagnetic layer between the third and fourth magnetic layers; and a fourth terminal electrically connected to the third magnetic layer; and a circuit configured to apply a write current between the first terminal and the second terminal and apply a first and second potentials to the third and fourth terminals respectively to write the first and second magnetoresistive elements, the first and second potentials being different from each other.

9 Claims, 8 Drawing Sheets

(51) Int. Cl.
  *H01L 43/08* (2006.01)
  *G11C 11/15* (2006.01)
(52) U.S. Cl.
  CPC ........ *G11C 11/1659* (2013.01); *H01L 27/228* (2013.01); *H01L 43/08* (2013.01)
(58) Field of Classification Search
  USPC .................................................. 365/158, 173
  See application file for complete search history.

(56) References Cited

U.S. PATENT DOCUMENTS

| | | | |
|---|---|---|---|
| 6,226,197 B1 * | 5/2001 | Nishimura | B82Y 10/00 257/E21.665 |
| 7,663,848 B1 * | 2/2010 | Huai | B82Y 25/00 360/324.2 |
| 8,154,913 B2 | 4/2012 | Fukami et al. | |
| 8,897,061 B2 | 11/2014 | Ezaki | |
| 9,076,537 B2 | 7/2015 | Khvalkovskiy et al. | |
| 9,076,954 B2 * | 7/2015 | Khvalkovskiy | H01L 43/02 |
| 9,343,658 B2 | 5/2016 | Wang et al. | |
| 2002/0009840 A1 * | 1/2002 | Torok | G11C 11/16 438/171 |
| 2002/0027803 A1 * | 3/2002 | Matsui | G11C 11/15 365/173 |
| 2010/0080048 A1 * | 4/2010 | Liu | G11C 11/16 365/157 |
| 2013/0182501 A1 | 7/2013 | Sakimura et al. | |
| 2014/0056061 A1 | 2/2014 | Khvalkovskiy et al. | |
| 2016/0247550 A1 | 8/2016 | Fukami et al. | |
| 2016/0268500 A1 * | 9/2016 | Furuhashi | H01L 27/228 |
| 2016/0379696 A1 * | 12/2016 | Kumura | G11C 11/161 257/421 |
| 2017/0077177 A1 | 3/2017 | Shimomura et al. | |
| 2017/0179372 A1 * | 6/2017 | Braganca | H01L 27/222 |

FOREIGN PATENT DOCUMENTS

| | | |
|---|---|---|
| JP | 2014-45196 | 3/2014 |
| JP | 2017-59679 | 3/2017 |
| WO | WO 2009/054180 A1 | 4/2009 |
| WO | WO 2012/081453 A1 | 6/2012 |
| WO | WO 2015/068509 A1 | 5/2015 |
| WO | WO 2016/159017 A1 | 10/2016 |

\* cited by examiner

MAGNETIC MEMORY

CROSS REFERENCE TO RELATED APPLICATIONS

This application is based upon and claims the benefit of priority from the prior Japanese Patent Application No. 2016-235379, filed on Dec. 2, 2016, the entire contents of which are incorporated herein by reference.

FIELD

Embodiments described herein relate generally to magnetic memories.

BACKGROUND

Magnetic random access memories (MRAMs) are expected as nonvolatile random access memories (RAMs) capable of high-speed operations, and have been actively studied and developed.

The fundamental structure of a magnetic tunnel junction (MTJ) element that is a memory element of an MRAM is formed with three layers, which are a magnetic layer, an insulating layer, and another magnetic layer. One of the magnetic layers is called the storage layer, and the other one of the magnetic layers is called the reference layer. The intermediate insulating layer is called the tunnel barrier, and is formed with an insulator that is very thin but can allow a tunneling current to flow. The magnetization direction of the reference layer does not change before and after a write current is applied thereto. The magnetization direction of the storage layer is changeable, and may be in a parallel state or in an antiparallel state with respect to the magnetization direction of the reference layer. When the magnetization directions of the storage layer and the reference layer are parallel to each other, the electrical resistance between the storage layer and the reference layer via the tunnel barrier is low, because of a magnetoresistive effect. When the magnetization directions of the storage layer and the reference layer are antiparallel to each other, the electrical resistance is high, because of a magnetoresistive effect.

A known method of causing a magnetization switching (writing) in the storage layer of an MTJ element uses a spin Hall effect or a spin-orbit interaction (spin-orbit coupling). A spin-orbit interaction is a phenomenon in which electric current is applied to a conductive nonmagnetic layer so that electrons having spin angular momenta (hereinafter also referred to simply as the spin) of the opposite orientations from each other are scattered in the opposite directions, and a spin current is generated. There are known MRAMs of a SOT (Spin Orbit Torque) type in which a MTJ element is stacked on a nonmagnetic layer having a large spin-orbit interaction, and the magnetization direction of the storage layer of the MTJ element is switched by SOT. However, in an MRAM of this type, two transistors are required for one MTJ element in each memory cell, and therefore, miniaturization of the memory cells is difficult to achieve.

Meanwhile, there also are known MRAMs in which voltage is applied to an MTJ element, and a magnetization switching is caused by virtue of a voltage-controlled magnetic anisotropy (VCMA) effect that changes the anisotropy energy of magnetization. A cell structure of an MRAM of this VCMA type can be formed with one MTJ element and one corresponding transistor. However, to control the processional movement of magnetization by adjusting the pulse width of the write pulse in write principles, extremely accurate pulse width control on the order of picoseconds needs to be performed, and RC delay in wiring lines due to an increased capacity presents another problem.

To solve these problems, a spintronics memory has been suggested. The spintronics memory performs writing collectively on MTJ elements (equivalent to eight bits, for example), using both the SOT method and the VCMA method. Such a spintronics memory has a structure in which the MTJ elements are stacked on a nonmagnetic layer made of a conductive material having a large spin-orbit interaction.

When writing is performed in the structure of this spintronics memory, a potential is applied to the reference layer of the MTJ element, and a write current is applied to the nonmagnetic layer of the MTJ element. At the time of writing, the write current does not pass through the tunnel barrier in the MTJ element. Accordingly, the reliability of the tunnel barrier becomes higher, and read disturb is alleviated as the current paths of the read current and the write current differ from each other, as in an MRAM of the SOT type. Furthermore, the spintronics memory uses VCMA to adjust the energy barrier. Thus, the required degree of pulse width accuracy, which presents a problem in a magnetization switching by VCMA, is lowered.

In the spintronics memory, however, the write window at a time of writing, or the difference between the high-resistance value and the low-resistance value to be written into an MTJ element, becomes narrower, as will be described later.

Also, the read window at a time of reading, or the difference between the high-resistance value and the low-resistance value to be read from an MTJ element, becomes smaller.

DETAILED DESCRIPTION

A magnetic memory according to an embodiment includes: a first terminal and a second terminal; a conductive layer including first to fourth regions, the second region being between the first region and the fourth region, the third region being between the second region and the fourth region, the first region being electrically connected to the first terminal, and the fourth region being electrically connected to the second terminal; a first magnetoresistive element disposed corresponding to the second region, the first magnetoresistive element including: a first magnetic layer; a second magnetic layer between the second region and the first magnetic layer; a first nonmagnetic layer between the first magnetic layer and the second magnetic layer; and a third terminal electrically connected to the first magnetic layer; a second magnetoresistive element disposed corresponding to the third region, the second magnetoresistive element including: a third magnetic layer; a fourth magnetic layer between the third region and the third magnetic layer; a second nonmagnetic layer between the third magnetic layer and the fourth magnetic layer; and a fourth terminal electrically connected to the third magnetic layer; and a circuit configured to apply a write current between the first terminal and the second terminal and apply a first and second potentials to the third and fourth terminals respectively to write the first and second magnetoresistive elements, the first and second potentials being different from each other.

First Embodiment

Figure 1:
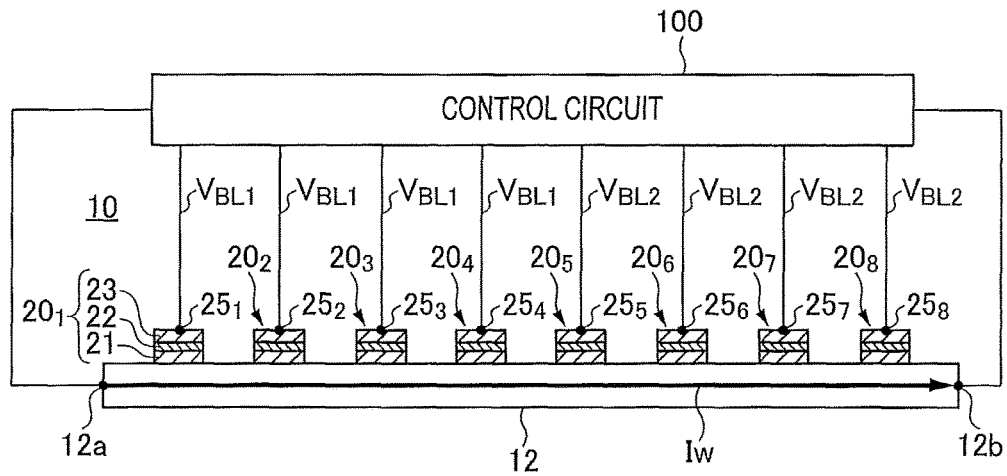
FIG. 1 is a diagram showing a magnetic memory according to a first embodiment.
Figure 2:
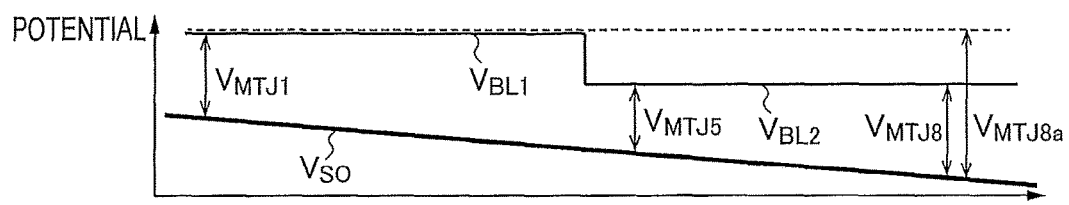
FIG. 2 is a graph for explaining operation of the magnetic memory of the first embodiment.
Figure 3:
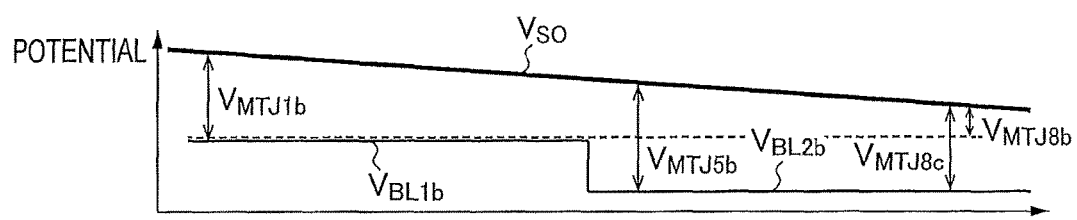
FIG. 3 is a graph for explaining operation of the magnetic memory of the first embodiment.

Referring now to FIGS. 1 through 3, a magnetic memory according to a first embodiment is described. The magnetic memory of the first embodiment includes at least one memory cell, and this memory cell is shown in FIG. 1. This memory cell 10 includes: a nonmagnetic layer (also called the conductive layer) 12; a first terminal 12a and a second terminal 12b that are disposed on the nonmagnetic layer 12; magnetoresistive elements $20_1$ through $20_8$ disposed on the portion of the nonmagnetic layer 12 located between the first terminal 12a and the second terminal 12b; and a control circuit 100. In this magnetic memory, the magnetoresistive elements are aligned on the same nonmagnetic layer 12. In this embodiment, the eight magnetoresistive elements $20_1$ through $20_8$ are arranged on the same nonmagnetic layer 12, for example. However, the number of the magnetoresistive elements is not necessarily eight.

The magnetoresistive elements $20_1$ through $20_8$ are sequentially arranged from the left end of the nonmagnetic layer 12 toward the right end of the nonmagnetic layer 12. Each magnetoresistive element $20_i$ (i=1, . . . , 8) has a structure in which a magnetic layer (also called the storage layer) 21, a nonmagnetic layer 22, a magnetic layer (also called the reference layer) 23 are stacked on the conductive layer 12. Each magnetoresistive element $20_i$ (i=1, . . . , 8) includes a terminal $25_i$ electrically connected to the magnetic layer 23. The terminal $25_i$ (i=1, . . . , 8) of each magnetoresistive element $20_i$ is electrically connected to the control circuit 100. Here, "A" being electrically connected to "B" means that "A" may be connected directly to "B", or "A" may be connected to "B" via a conductor.

In this embodiment, the magnetic layer 21 and the magnetic layer 23 each have in-plane magnetization, or a magnetization direction perpendicular to the stacking direction of the stack structure. However, the magnetic layer 21 and the magnetic layer 23 may each have vertical magnetization, or a magnetization direction parallel to the stacking direction of the stack structure. In this embodiment, each magnetoresistive element $20_i$ (i=1, . . . , 8) is described as a magnetic tunnel junction (MTJ) element in which the nonmagnetic layer 22 includes an insulator. However, each magnetoresistive element $20_i$ (i=1, . . . , 8) may be a giant magnetoresistive (GMR) element in which the nonmagnetic layer 22 is a nonmagnetic metal layer.

The magnetic layer 21 is formed with a magnetic material containing Fe, Ni, Co, or an alloy of these elements. The magnetic layer 21 may have a stack structure in which two magnetic layers are stacked, with a nonmagnetic layer being interposed between these magnetic layers. Further, the magnetic layer 21 may have a stack structure in which synthetic antiferromagnetic (SAF) coupling is formed between these two magnetic layers, so that the two magnetic layers are in an antiparallel state with respect to each other.

The nonmagnetic layer 22 is formed with MgO, for example. It is known that a MgO layer oriented in the (001) direction achieves a high magnetoresistive effect. The resistance area product (RA) of each MTJ element, or the product of the resistance value and the area of each MTJ element, is preferably 10 $\Omega\mu m^2$ to 2000 $\Omega\mu m^2$.

The magnetic layer 23 is formed with a magnetic material containing at least one element selected from the group consisting of Fe, Ni, and Co, or a magnetic alloy material containing at least one element selected from the above group.

Like the magnetic layer 21, the magnetic layer 23 may have a stack structure in which two magnetic layers are stacked, with a nonmagnetic layer being interposed between these magnetic layers. The two magnetic layers may be SAF-coupled to each other. Further, an antiferromagnetic layer of PtMn, IrMn, or the like may be provided on the opposite side of the magnetic layer 23 from the nonmagnetic layer 22, to fix the magnetization direction of the magnetic layer 23.

The nonmagnetic layer 12 is formed with a conductive material having a large spin-orbit interaction so that the magnetization direction of the storage layer 21 of each of the MTJ elements $20_1$ through $20_8$ can be reversed by spin orbit torque (SOT) when the control circuit 100 applies a write current Iw between the first terminal 12a and the second terminal 12b at a time of writing. Examples of materials for the nonmagnetic layer 12 include Ta having a β structure, W having a β structure, and Pt. The write current Iw is applied to the nonmagnetic layer 12 between the first terminal 12a and the second terminal 12b by a write circuit (not shown) provided in the control circuit 100. When reading is performed, a read current is applied between the MTJ element from which information is to be read and the first terminal 12a or the second terminal 12b, and the resistance value of the MTJ element is measured with a sense amplifier. The read current is output from a read circuit (not shown) provided in the control circuit 100. The sense amplifier is also provided in the control circuit 100.

When writing is performed on the MTJ elements $20_1$ through $20_8$ in the magnetic memory of this embodiment, the write circuit applies a potential to the terminals $25_1$ through $25_8$ of the MTJ elements $20_1$ through $20_8$ on which the writing is to be performed, and applies a write current to the nonmagnetic layer 12, with the energy barrier necessary for a switching being lowered by a voltage-controlled magnetic anisotropy (VCMA) effect. In this manner, writing can be performed collectively on the MTJ elements $20_1$ through $20_8$. For example, in an MTJ element to which a potential of V=Va is applied, the energy barrier for a magnetization switching becomes lower, and magnetization is switched when a current is applied to the nonmagnetic layer. However, in an MTJ element to which a potential of V=Vda is applied, the energy barrier for a switching is high, and magnetization is not switched even when a current is applied. Depending on the materials of the magnetic layers and the tunnel barrier, the voltage Va may be a positive potential with respect to the voltage Vda, or may be a negative potential with respect to the voltage Vda. Alternatively, the potential Vda may be 0 V.

In a case where data (information) "0, 0, 1, 1, 0, 1, 0, 1" is written into the MTJ elements $20_1$ through $20_8$ equivalent to eight bits, the potential V=Va is applied to the terminals $25_1$ through $25_8$ of the eight MTJ elements $20_1$ through $20_8$ to lower the energy barrier, and the write current Iw is applied to the nonmagnetic layer 12, so that data "0" is written into the eight MTJ elements $20_1$ through $20_8$ in a first step. In a second step, the potential V=Va is applied to the terminals $25_3$, $25_4$, $25_6$, and $25_8$ of the MTJ elements $20_3$, $20_4$, $20_6$, and $20_8$ into which data "1" is to be written, and the potential V=Vda is applied to the terminals $25_1$, $25_2$, $25_5$, and $25_7$ of the other MTJ elements $20_1$, $20_2$, $20_5$, and $20_7$. A write current flowing in the opposite direction from that in the first step is then applied to the nonmagnetic layer 12 in this state, so that the data "1" can be written collectively into the selected MTJ elements $20_3$, $20_4$, $20_6$, and $20_8$. When data is read from an MTJ element, a read current is applied between the terminal of the MTJ element from which data is to be read, such as the terminal $25_1$ of the MTJ element $20_1$, and the first terminal 12a or the second terminal 12b of the nonmagnetic layer 12, and the resistance of this MTJ element is then read.

A material with a large spin-orbit interaction, such as Ta having a β structure, is used for the nonmagnetic layer 12, and the resistivity of such a material is normally high. Therefore, a voltage drop is caused by the write current Iw, and the voltage to be applied between the nonmagnetic layer 12 and each of the terminals $25_1$ through $25_8$ of the MTJ elements $20_1$ through $20_8$ varies with the positions of the MTJ elements $20_1$ through $20_8$ arranged on the nonmagnetic layer 12. For example, in a case where β–Ta is used as the nonmagnetic layer 12, the specific resistance of the nonmagnetic layer 12 is approximately 200 Ωcm. If the density of the write current is $2\times10^7$ A/cm², and the distance between two adjacent MTJ elements is 40 nm, the voltage drop between the two adjacent MTJ elements is 200 μΩcm× $2\times10^7$ A/cm²×$4\times10^{-6}$ cm=0.016 V. If the number of the MTJ elements arranged on one nonmagnetic layer 12 is eight, the potential difference between the MTJ elements located at both ends is 0.016 V×(8−1) to 0.11 V, while the write potential is being applied. The potential difference due to this voltage drop narrows the write window, or the difference between the high-resistance value and the low-resistance value to be written into the MTJ elements.

In view of this, the differences in the voltage to be applied to the MTJ elements $20_1$ through $20_8$ due to the voltage drop caused by the differences in position among the MTJ elements $20_1$ through $20_8$ arranged on the nonmagnetic layer 12 are reduced in the magnetic memory of this embodiment. Referring now to FIGS. 2 and 3, a method of reducing the differences is described.

FIG. 2 shows the potential to be applied to the terminals $25_1$ through $25_8$ of the MTJ elements $20_1$ through $20_8$ by the control circuit 100 at a time of writing. In a case where the write current Iw flows in the nonmagnetic layer 12 from left to right in the drawing as shown in FIG. 1, for example, the potential $V_{SO}$ of the nonmagnetic layer 12 is higher on the left side and is lower on the right side. However, the voltage drop with respect to the voltage to be applied is enlarged in FIG. 2. The potential difference between the leftmost MTJ element $20_1$ and the rightmost MTJ element $20_8$ on the nonmagnetic layer 12 is proportional to the specific resistance of the nonmagnetic layer 12, the write current density, and the distance between the MTJ element $20_1$ and the MTJ element $20_8$. Therefore, if a low-resistance material is used as the material for the nonmagnetic layer 12, the potential difference can be reduced. However, a material with a large spin-orbit interaction normally has a high resistance. In a case where the specific resistance of the nonmagnetic layer 12 is 200 μΩcm, the eight MTJ elements $20_1$ through $20_8$ are aligned at intervals of 40 nm, and the write current density is $2\times10^7$ A/cm², the potential difference between the MTJ element $20_1$ and the MTJ element $20_8$ at both ends is 0.1 V.

On the other hand, if the same potential $V_{BL1}$ is applied to the terminals $25_1$ through $25_8$ of the eight MTJ elements $20_1$ through $20_8$ as indicated by a dashed line in FIG. 2, the voltages between the nonmagnetic layer 12 and the terminals of the MTJ elements located in different positions vary. For example, a voltage $V_{MTJ1}$ and a voltage $V_{MTJ8a}$ are applied to the MTJ element $20_1$ and the MTJ element $20_8$, respectively, and the voltage $V_{MTJ1}$ is lower than the voltage $V_{MTJ8a}$. As for the other MTJ elements $20_2$ through $20_7$, a voltage between the voltage $V_{MTJ1}$ and the voltage $V_{MTJ8a}$ is applied to each MTJ element.

In view of this, the potential to be applied to the terminal of each MTJ element is adjusted in accordance with the position of the MTJ element in this embodiment, so that the variation of the voltage to be applied between the nonmagnetic layer 12 and the respective terminals $25_1$ through $25_8$ of the MTJ elements $20_1$ through $20_8$ is reduced. An example of the potential to be applied to the terminals $25_1$ through $25_8$ of the MTJ elements $20_1$ through $20_8$ is indicated by a solid line in FIG. 2. In this example, two kinds of potentials are applied to the terminals $25_1$ through $25_8$. A potential $V_{BL1}$ is applied to the terminals $25_1$ through $25_4$ of the MTJ elements $20_1$ through $20_4$, and a potential $V_{BL2}$ ($<V_{BL1}$) is applied to the terminals $25_5$ through $25_8$ of the MTJ elements $20_5$ through $20_8$. The potentials are set so that the potential difference $V_{MTJ1}$ (=$V_{BL1}-V_{SO}$) between the terminal $25_1$ of the MTJ element $20_1$ and the nonmagnetic layer 12 becomes equal to the potential difference $V_{MTJ5}$ (=$V_{BL2}-V_{SO}$) between the terminal $25_5$ of the MTJ element $20_5$ and the nonmagnetic layer 12. With this, the entire potential difference, or the potential difference (voltage) between the reference layer of each MTJ element and the nonmagnetic layer 12, is reduced.

For example, as shown in FIG. 2, the voltage to be applied between the terminal $25_8$ of the MTJ element $20_8$ and the nonmagnetic layer 12 is reduced from $V_{MTJ8a}$ (=$V_{BL1}-V_{SO}$) to $V_{MTJ8}$ (=$V_{BL2}-V_{SO}$), and the difference between the voltage $V_{MTJ1}$ and the voltage $V_{MTJ8}$ is reduced to ½ of the difference between the voltage $V_{MTJ1}$ and the voltage $V_{MTJ8a}$. It should be noted that the potentials $V_{BL1}$ and $V_{BL2}$ to be applied to the terminals $25_1$ through $25_8$ of the MTJ elements $20_1$ through $20_8$ are supplied from the control circuit 100.

In a case where a reverse spin torque is applied to the MTJ elements $20_1$ through $20_8$, the polarity of the current to be applied to the nonmagnetic layer 12 is reversed. In this case, the orientation of the potential gradient is the reverse of that in the case illustrated in FIG. 2. Therefore, $V_{BL1}$ is applied as the potential at a time of writing to the terminals $25_5$ through $25_8$ of the MTJ elements $20_5$ through $20_8$, and $V_{BL2}$ is applied to the terminals $25_1$ through $25_4$ of the MTJ elements $20_1$ through $20_4$.

Depending on the combination of the material of the storage layer of each of the MTJ elements $20_1$ through $20_8$ and the material of the tunnel barrier, the reversing current, which is the current to reverse the magnetization of each storage layer, might become lower when the potential to be applied to each MTJ element is higher than the potential of the nonmagnetic layer 12, or the reversing current might become lower when the potential to be applied to each MTJ element is lower than the potential of the nonmagnetic layer 12. For example, the potential to be applied to the terminals $25_1$ through $25_8$ of the MTJ elements $20_1$ through $20_8$ is made higher than the potential $V_{SO}$ of the nonmagnetic layer 12 in one case, and the potential to be applied to the terminals $25_1$ through $25_8$ of the MTJ elements $20_1$ through $20_8$ is made lower than the potential $V_{SO}$ of the nonmagnetic layer 12 in another. FIG. 2 illustrates the former case.

FIG. 3 illustrates the latter case, or a case where the potential $V_{BL1}$ to be applied to the terminals $25_1$ through $25_4$ of the MTJ elements $20_1$ through $20_4$ is lower than the potential $V_{SO}$ of the nonmagnetic layer 12. In each MTJ element $20_i$ (i=1, . . . , 8) in this case, the storage layer is formed with CoFeB, and the tunnel barrier is formed with MgO, to lower the reversing current. In this case, when the same potential $V_{BL1}$ is applied to the terminals $25_1$ through $25_8$ of all the MTJ elements $20_1$ through $20_8$ as indicated by a dashed line in FIG. 3, the relationship between the voltage $V_{MTJ1b}$ to be applied between the terminal $25_1$ of the MTJ element $20_1$ and the nonmagnetic layer 12 and the voltage $V_{MTJ8b}$ to be applied between the terminal $25_8$ of the MTJ element $20_8$ and the nonmagnetic layer 12 is expressed as $|V_{MTJ1b}|>|V_{MTJ8b}|$.

By an example method of reducing the voltage variation, the potentials to be applied to the terminals $25_1$ through $25_8$ of the MTJ elements $20_1$ through $20_8$ are adjusted to two kinds. As indicated by a solid line in FIG. 3, for example, a potential $V_{BL1b}$ is set for the terminals $25_1$ through $25_4$ of the MTJ elements $20_1$ through $20_4$, and a potential $V_{BL2b}$ ($<V_{BL1b}$) is set for the terminals $25_5$ through $25_8$ of the MTJ elements $20_5$ through $20_8$. The potentials are set so that the voltage $V_{MTJ1b}$ ($=V_{SO}-V_{BL1b}$) to be applied between the nonmagnetic layer 12 and the terminal $25_1$ of the MTJ element $20_1$ becomes equal to the voltage $V_{MTJ5b}$ ($=V_{SO}-V_{BL2b}$) to be applied between the nonmagnetic layer 12 and the terminal $25_5$ of the MTJ element $20_5$. With this, the voltage difference between the voltage $V_{MTJ1b}$ to be applied between the nonmagnetic layer 12 and the terminal $25_1$ of the MTJ element $20_1$ and the voltage $V_{MTJ8b}$ to be applied between the nonmagnetic layer 12 and the terminal $25_8$ of the MTJ element $20_8$ is almost halved. It should be noted that the potentials $V_{BL1b}$ and $V_{BL2b}$ to be applied to the terminals $25_1$ through $25_8$ of the MTJ elements $20_1$ through $20_8$ are supplied from the control circuit 100.

Also, a potential in such a direction as to prevent a magnetization switching may be applied to the terminal of each MTJ element on which writing is not to be performed. In this case, the potential to be applied to the terminal of each MTJ element on which writing is to be performed has the opposite polarity of that of the potential to be applied to the terminal of each MTJ element on which writing is not to be performed. Different potentials to prevent a magnetization switching may be applied to MTJ elements.

As described above, according to the first embodiment, variation of the voltage between the nonmagnetic layer 12 and the terminals $25_1$ through $25_8$ of the MTJ elements $20_1$ through $20_8$ at a time of writing can be reduced, and resistance variation among the MTJ elements after the writing can also be reduced. That is, this embodiment provides a magnetic memory that can reduce resistance variation during operation due to differences in position among MTJ elements arranged on a nonmagnetic layer.

Second Embodiment

Figure 4:
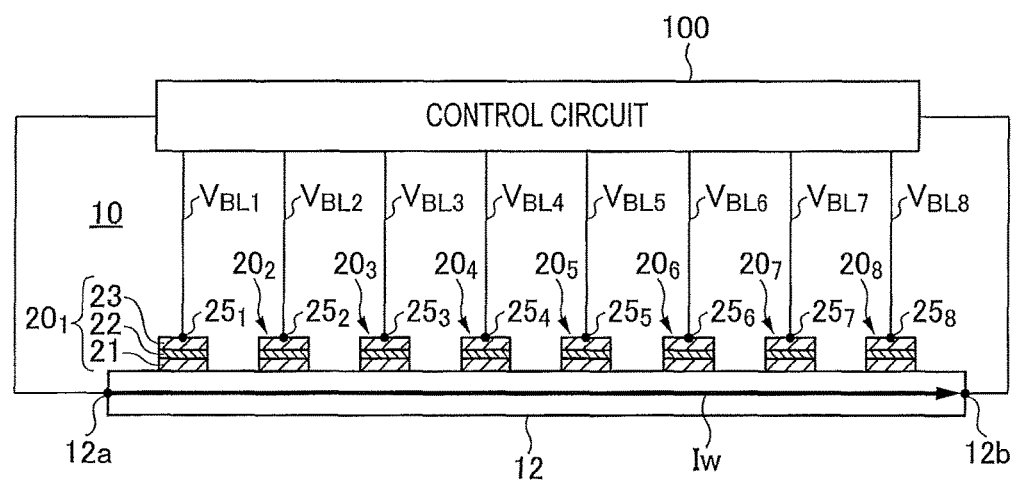
FIG. 4 is a diagram showing a magnetic memory according to a second embodiment.
Figure 5:
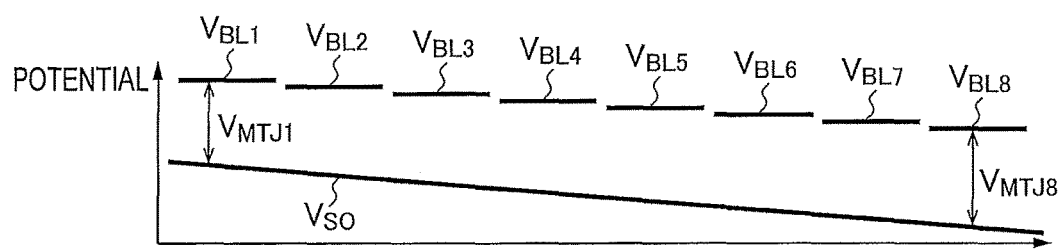
FIG. 5 is a graph for explaining operation of the magnetic memory of the second embodiment.

Referring now to FIGS. 4 and 5, a magnetic memory according to a second embodiment is described. The magnetic memory of the second embodiment includes at least one memory cell, and this memory cell is shown in FIG. 4. The memory cell 10 of the second embodiment has the same configuration as the memory cell 10 shown in FIG. 1, except that the potentials to be applied to the terminals $25_i$ (i=1, . . . , 8) of the respective elements $20_i$ at a time of writing differ from one another.

In this embodiment, at a time of writing, a potential $V_{BLi}$ (i=1, . . . , 8) is applied from the control circuit 100 to the terminal $25_i$ of each MTJ element $20_i$. As shown in FIG. 5, the potentials $V_{BL1}$ through $V_{BL8}$ differ from one another, and are adjusted in accordance with a voltage drop in the nonmagnetic layer 12 so that the voltage between the nonmagnetic layer 12 and the respective terminals $25_1$ through $25_8$ of the MTJ elements $20_1$ through $20_8$ becomes constant. For example, the adjustment is performed so that the voltage $V_{MTJ1}$ ($=V_{BL1}-V_{SO}$) between the terminal $25_1$ of the MTJ element $20_1$ and the nonmagnetic layer 12 becomes substantially equal to the voltage $V_{MTJ8}$ ($=V_{BL8}-V_{SO}$) between the terminal $25_8$ of the MTJ element $20_8$ and the nonmagnetic layer 12. Here, $V_{SO}$ represents the potential of the nonmagnetic layer 12, as shown in FIG. 5.

As a result, the voltage to be applied between the terminal $25_i$ (i=1, . . . , 8) of each MTJ elements $20_i$ and the nonmagnetic layer 12 does not vary with the voltage drop in the nonmagnetic layer 12 due to a write current Iw, and is maintained constant. In a case where the polarity of writing is reversed, or where the direction in which the write current Iw flows is reversed, the direction in which the voltage drops is also reversed. In this case, the potential to be applied to the terminal $25_1$ of the MTJ $20_1$ is set at $V_{BL8}$ shown in FIG. 5, and the potential to be applied to the terminal $25_2$ of the MTJ element $20_2$ is set at the potential $V_{BL7}$, so that the potential to be applied to the terminal $25_8$ of the MTJ element $20_8$ becomes $V_{BL1}$. In a case where the potentials to be applied to the terminals $25_1$ through $25_8$ of the MTJ elements $20_1$ through $20_8$ are set at lower values than the potential of the nonmagnetic layer 12 as shown in FIG. 3, voltage adjustment may be performed in the same manner as in the case illustrated in FIG. 5.

In the case described above, the resistance of each of the MTJ elements $20_1$ through $20_8$ is assumed to be high, and the current variation in the nonmagnetic layer 12 due to the potentials applied to the terminals of the MTJ elements at a time of writing is assumed to be relatively small. However, the currents flowing from the MTJ elements into the nonmagnetic layer 12 at a time of writing may be taken into consideration in setting voltages. In that case, voltage setting is not performed like simply allocating the potential $V_{BL1}$ to the MTJ element $20_1$, but the data to be written determines which voltage should be applied to which MTJ element.

As described above, like the first embodiment, the second embodiment also provides a magnetic memory that can reduce resistance variation during operation due to differences in position among MTJ elements arranged on a nonmagnetic layer.

Third Embodiment

Figure 6:
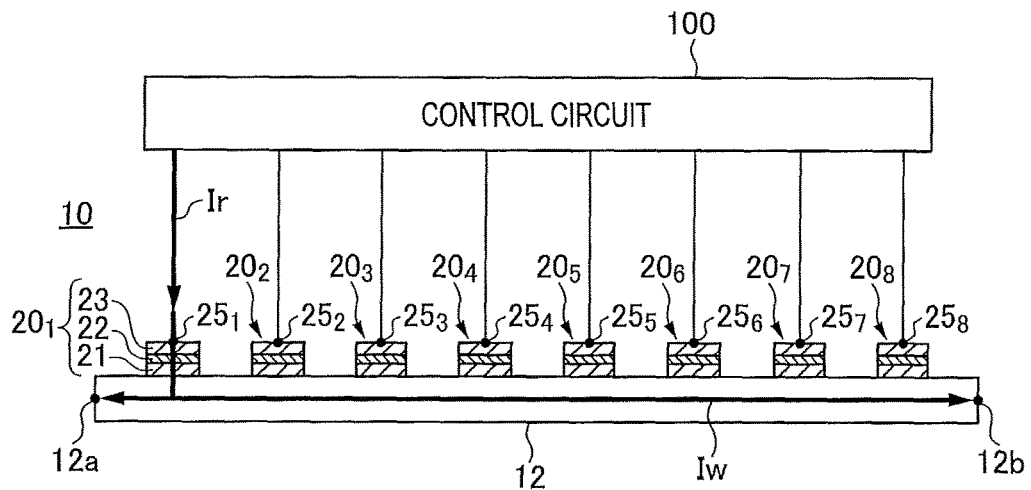
FIG. 6 is a diagram showing a magnetic memory according to a third embodiment.
Figure 7:
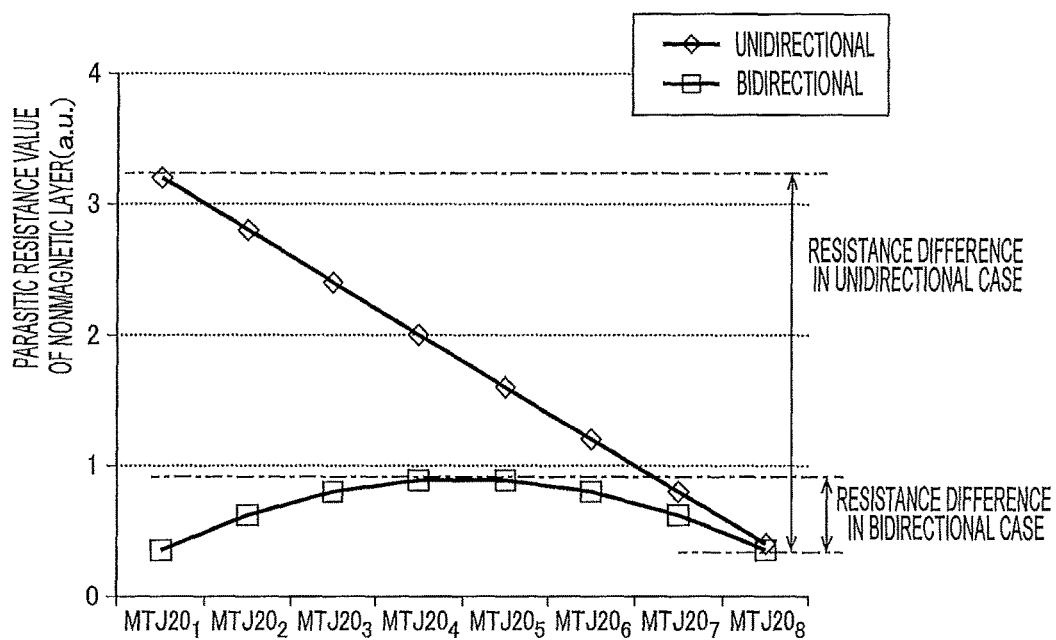
FIG. 7 is a graph for explaining the effects of the magnetic memory of the third embodiment.

Referring now to FIGS. 6 and 7, a magnetic memory according to a third embodiment is described. The magnetic memory of the third embodiment includes memory cells $10_1$, $10_2$, . . . . Each memory cell $10_i$ (i=1, 2, . . . ) has the same configuration as the memory cell 10 of the first embodiment shown in FIG. 1, but the method of reading data from each memory cell $10_i$ differs from that of the first embodiment.

In a spintronics memory, a current is normally applied to an MTJ element, to read data from the MTJ element. The resistance value of the MTJ element is then read with a sense amplifier, and is determined to be data "0" or data "1". At this point, the parasitic resistance of the nonmagnetic layer 12 varies with the positions of the MTJ elements $20_1$ through $20_8$ arranged on the nonmagnetic layer 12, and the resistance value of the read current path also varies. For example, the resistance in the nonmagnetic layer 12 differs between the MTJ element $20_1$ located at one end of the nonmagnetic layer 12 and the MTJ element $20_8$ located at the other end of the nonmagnetic layer 12. Therefore, when viewed from the read circuit (not shown) provided in the control circuit 100, there is effective resistance variation, and the read window, or the value obtained by dividing the difference between a high-resistance value and a low-resistance value read from the MTJ element by the resistance variation, becomes smaller.

In view of this, a read current Ir to be applied from the terminal $25_1$ of the MTJ element $20_1$ to the nonmagnetic layer 12 is made to flow in two directions in the nonmagnetic layer 12 (see FIG. 6), and the resistances at both ends of the nonmagnetic layer 12 are in parallel when viewed from the control circuit 100 (the read circuit) in the third embodiment.

FIG. 7 shows the calculated values of parasitic resistances of the nonmagnetic layer 12 viewed from the read circuit in a case where the read current is made to flow in one direction and in a case where the read current is made to flow in two directions. The abscissa axis indicates the positions of the MTJ elements $20_1$ through $20_8$, and the ordinate axis indicates the calculated values of parasitic resistances of the nonmagnetic layer 12. In FIG. 7, the rhombuses indicate the parasitic resistance of the nonmagnetic layer 12 in a case where the read current Ir is applied from the terminal $25_i$ (i=1, . . . , 8) of each MTJ element $20_i$ to the nonmagnetic layer 12, and is made to flow in one direction, such as the direction from the first terminal 12a toward the second terminal 12b. Meanwhile, the squares indicate the parasitic resistance of the nonmagnetic layer 12 in a case where the read current Ir is applied from the terminal $25_i$ (i=1, . . . , 8) of each MTJ element $20_i$ to the nonmagnetic layer 12, and is made to flow in the two directions, which are the direction toward the first terminal 12a and the direction toward the second terminal 12b. In the case where the read current Ir is made to flow in one direction, the parasitic resistance decreases linearly in the direction from the MTJ element $20_1$ toward the MTJ element $20_8$.

In the case where the read current Ir is made to flow in the two directions, on the other hand, the parasitic resistance becomes largest at the MTJ element $20_4$ and the MTJ element $20_5$. However, the largest value is approximately ¼ of the largest value in the case where the read current Ir is made to flow in one direction. That is, as can be seen from FIG. 7, as the read current Ir is made to flow in the two directions, the variation of the parasitic resistance of the nonmagnetic layer 12 due to the differences in position among the MTJ elements can be made much smaller than in the case where the read current Ir is made to flow in one direction.

Figure 8:
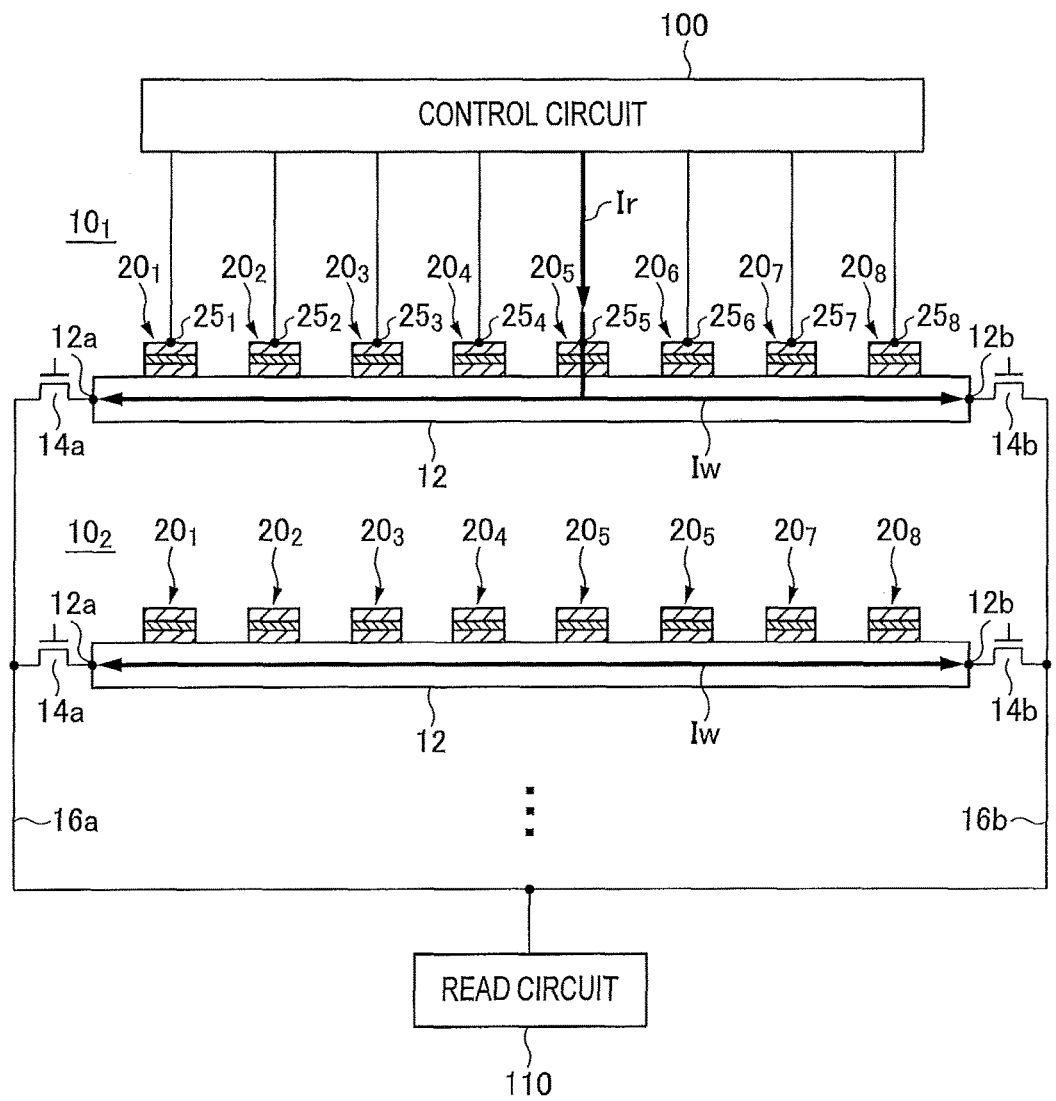
FIG. 8 is a diagram showing an example for obtaining the magnetic memory of the third embodiment.

Furthermore, no potential is normally applied to the terminal of the MTJ element at a time of reading in a spintronics memory, and therefore, the reversing energy barrier of the storage layer of the MTJ element does not become lower. Because of this, the probability of read disturb, which will reverse magnetization with the read current, is low in the first place. However, where a bidirectional read current path is adopted as in this embodiment shown in FIG. 6, the read current Ir flowing in the nonmagnetic layer 12 is divided and becomes lower accordingly. Thus, the probability of read disturb can be made even lower. To achieve the read current path shown in FIG. 6, transistors 14a and 14b are provided on both sides of the nonmagnetic layer 12, read wiring lines 16a and 16b connected to the transistors 14a and 14b are further provided, and the read wiring lines 16a and 16b are connected to a read circuit 110, as shown in FIG. 8. At a time of reading, both transistors 14a and 14b are turned on, so that the reading can be performed. It should be noted that FIG. 8 is a diagram illustrating a case where the read current Ir is applied from the MTJ element $20_5$ to the nonmagnetic layer 12, and is made to flow in the two directions in the nonmagnetic layer 12.

As described above, according to the third embodiment, the parasitic resistance of the nonmagnetic layer 12 at a time of reading can be reduced, and effective variation of the resistance at a time of reading from the MTJ elements $20_1$ through $20_8$ can also be reduced. Thus, the resistance variation at a time of reading due to differences in position among the MTJ elements can be reduced. The polarity of the read current may be the reverse of the polarity shown in FIGS. 6, 8, and 9. That is, the read current may be applied to the nonmagnetic layer 12 from both sides of the nonmagnetic layer 12, and then to the MTJ element from which data is to be read, and the current joined at the MTJ element may be applied to the control circuit 100.

Fourth Embodiment

Figure 9:
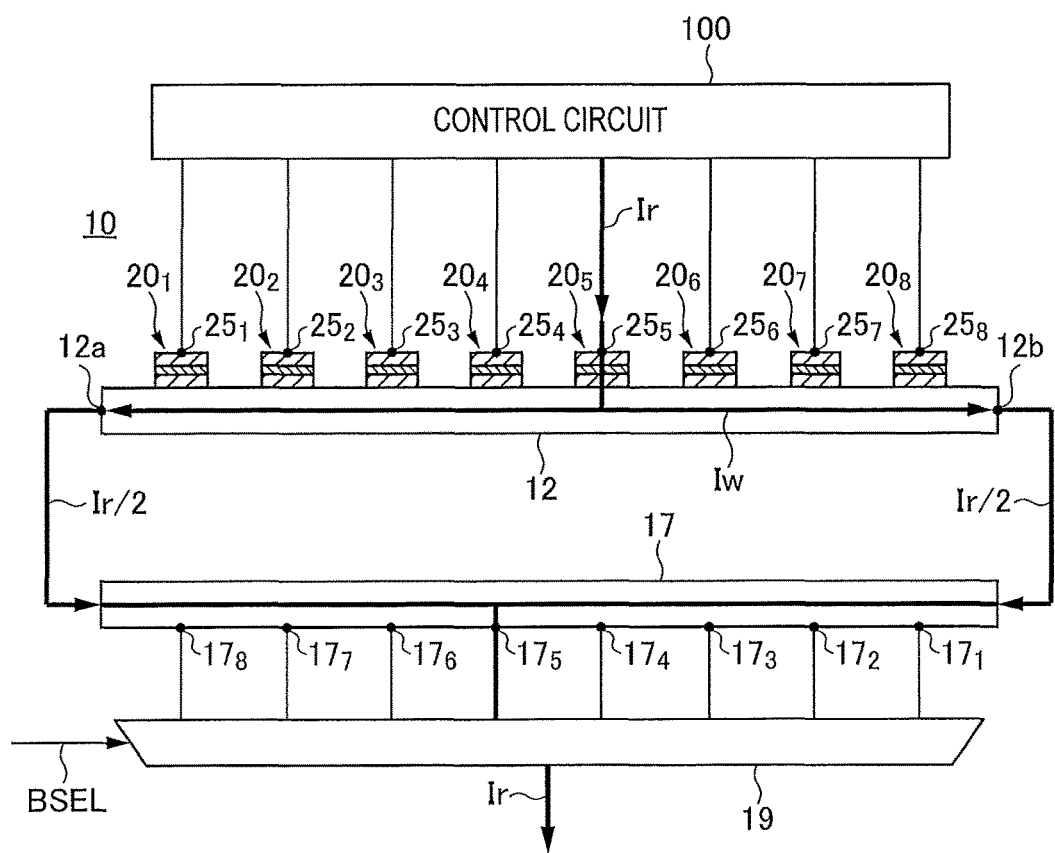
FIG. 9 is a diagram showing a magnetic memory according to a fourth embodiment.

FIG. 9 shows a magnetic memory according to a fourth embodiment. The magnetic memory of the fourth embodiment includes at least one memory cell, and this memory cell is shown in FIG. 9. The memory cell 10 of the fourth embodiment has the same configuration as the magnetic memory of the first embodiment shown in FIG. 1, except for further including a reference resistor 17 and a multiplexer (also called the select circuit) 19. In the magnetic memory of the fourth embodiment, a read current Ir is made to flow in the two directions in the nonmagnetic layer 12, as in the magnetic memory of the third embodiment.

The reference resistor 17 has substantially the same resistance value as the nonmagnetic layer 12. The reference resistor 17 may be formed with the same material as the nonmagnetic layer 12, or may be formed with a different material from the nonmagnetic layer 12. In a case where the magnetic memory includes more than one memory cell, or where the magnetic memory includes more than one nonmagnetic layer 12, the reference resistor 17 and the multiplexer 19 may be shared among the nonmagnetic layers 12. The reference resistor 17 includes extraction electrodes (terminals) $17_1$ through $17_8$ in positions corresponding to the positions of the MTJ elements $20_1$ through $20_8$ arranged on the nonmagnetic layer 12. Each extraction electrode $17_i$ (i=1, . . . , 8) is disposed in the position corresponding to the MTJ element $20_{9-i}$ on the nonmagnetic layer 12. For example, the extraction electrode $17_1$ is disposed in the position corresponding to the MTJ element $20_8$, and the extraction electrode $17_8$ is disposed in the position corresponding to the MTJ element $20_1$.

These extraction electrodes $17_1$ through $17_8$ are connected to eight input terminals of the multiplexer 19. At a time of reading, one of the extraction electrodes $17_1$ through $17_8$ is selected by the multiplexer 19, in accordance with a bit select address signal BSEL. For example, in a case where reading from an MTJ element $20_i$ (i=1, . . . , 8) is performed, the extraction electrode $17_{9-i}$ is selected.

In this configuration, application of the read current Ir flowing in the two directions of the nonmagnetic layer 12 at a time of reading can reduce the influence of the parasitic resistance due to the read path of the nonmagnetic layer 12 to much smaller influence than in the third embodiment, and the variation of the read current Ir output from the extraction electrodes $17_1$ through $17_8$ becomes smaller. That is, the effective resistance variation at a time of reading from the MTJ elements $20_1$ through $20_8$ can be reduced. Thus, the resistance variation at a time of reading due to differences in position among the MTJ elements can be reduced.

Fifth Embodiment

Figure 10:
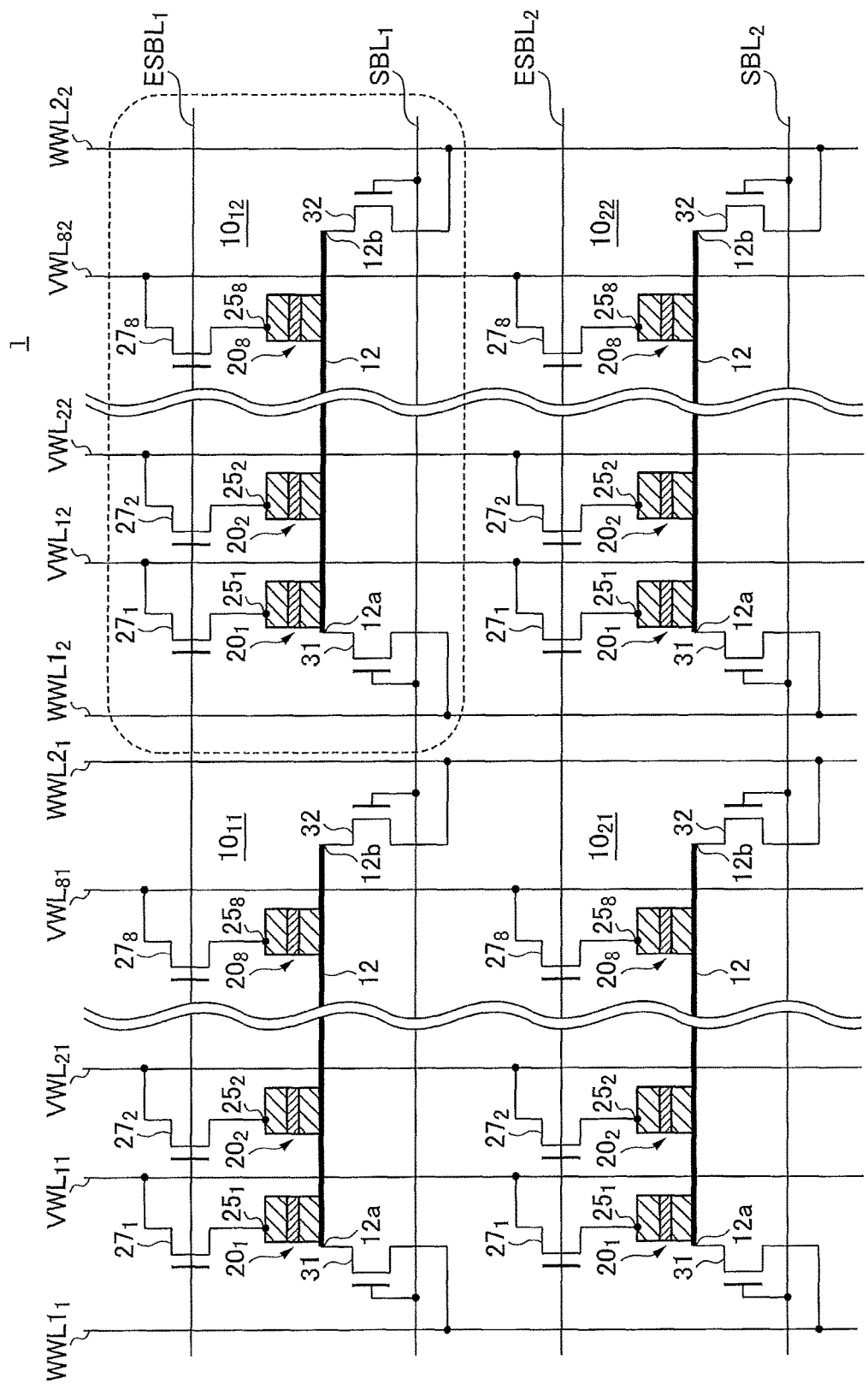
FIG. 10 is a circuit diagram showing a magnetic memory according to a fifth embodiment.

FIG. 10 shows a magnetic memory according to a fifth embodiment. The magnetic memory of the fifth embodiment includes a memory cell array 1 in which memory cells are arranged in a matrix. For example, memory cells $10_{11}$ through $10_{22}$ are arranged in a (2×2) matrix. Like the memory cell of the first embodiment shown in FIG. 1, each memory cell $10_{ij}$ (i, j=1, 2) includes a nonmagnetic layer 12 and magnetoresistive elements, such as eight magnetoresistive elements $20_1$ through $20_8$. Each memory cell $10_{ij}$ (i, j=1, 2) further includes a bit select transistor $27_i$ and byte select transistors 31 and 32.

Each magnetoresistive element $20_i$ (i=1, . . . , 8) is an MTJ element disposed on the nonmagnetic layer 12, and has a stack structure including a storage layer 21, a nonmagnetic layer 22, and a reference layer 23. Each MTJ element $20_i$ (i=1, . . . , 8) has a terminal $25_i$ electrically connected to the corresponding reference layer 23, and this terminal $25_i$ is connected to one (a first terminal) of the source and the drain of the bit select transistor $27_i$.

The other one (a second terminal) of the source and the drain of the bit select transistor $27_i$ (i=1, . . . , 8) is connected to a potential application word line $VWL_{ik}$ of the memory cell 14 (j, k=1, 2) to which the bit select transistor $27_i$ belongs, and the gate (a control terminal) of the bit select transistor $27_i$ is connected to an element select bit line $ESBL_k$.

In each memory cell $10_{ij}$ (i, j=1, 2), one (the first terminal) of the source and the drain of the byte select transistor 31 is connected to the first terminal 12a of the nonmagnetic layer 12, the other one (the second terminal) of the source and the drain is connected to a write word line $WWL1_j$, and the gate (the control terminal) is connected to a byte select bit line $SBL_j$.

Also, in each memory cell $10_{ij}$ (i, j=1, 2), one (the first terminal) of the source and the drain of the byte select transistor 32 is connected to the second terminal 12b of the nonmagnetic layer 12, the other one (the second terminal) of the source and the drain is connected to a write word line $WWL2_j$, and the gate (the control terminal) is connected to the byte select bit line $SBL_j$.

Writing in this magnetic memory is now described through an example case where writing is performed on the memory cell $10_{12}$ surrounded by a dashed line in the drawing. When writing is performed on the memory cell $10_{12}$, a write potential is applied to the potential application word lines $VWL_{12}$, $VWL_{22}$, and $VWL_{82}$ connected to the MTJ elements $20_1$, $20_2$, and $20_8$, which are the MTJ elements on which writing is to be performed among the MTJ elements $20_1$ through $20_8$ arranged on the nonmagnetic layer 12. The write potential application is performed by a control circuit (not shown), such as the control circuit 100 shown in FIG. 1. Further, the corresponding element select bit line $ESBL_1$ is controlled, to turn on the bit select transistors $27_1$ through $27_8$. As a result, the write potential is applied to the MTJ elements $20_1$, $20_2$, and $20_8$.

In the fifth embodiment, the potential application word lines $VWL_{12}$ through $VWL_{82}$ connected to the MTJ elements $20_1$ through $20_8$ are independent of one another, and thus, the value of the potential to be applied to the terminal $25_i$ (i=1, . . . , 8) of each MTJ element 20; can be adjusted. The byte select bit line $SBL_1$ is activated after the potentials of the write word line $WWL2_1$ and the write word line $WWL2_2$ are set, so that the byte select transistor 31 and the byte select transistor 32 are turned on, and the write current is applied to the conductive layer 12. In this manner, the magnetization of the storage layer 21 of each of the selected MTJ elements $20_1$, $20_2$, and $20_8$ can be reversed.

As described above, like the first embodiment, the fifth embodiment also provides a magnetic memory that can reduce resistance variation during operation due to differences in position among MTJ elements arranged on a nonmagnetic layer.

Sixth Embodiment

Figure 11:
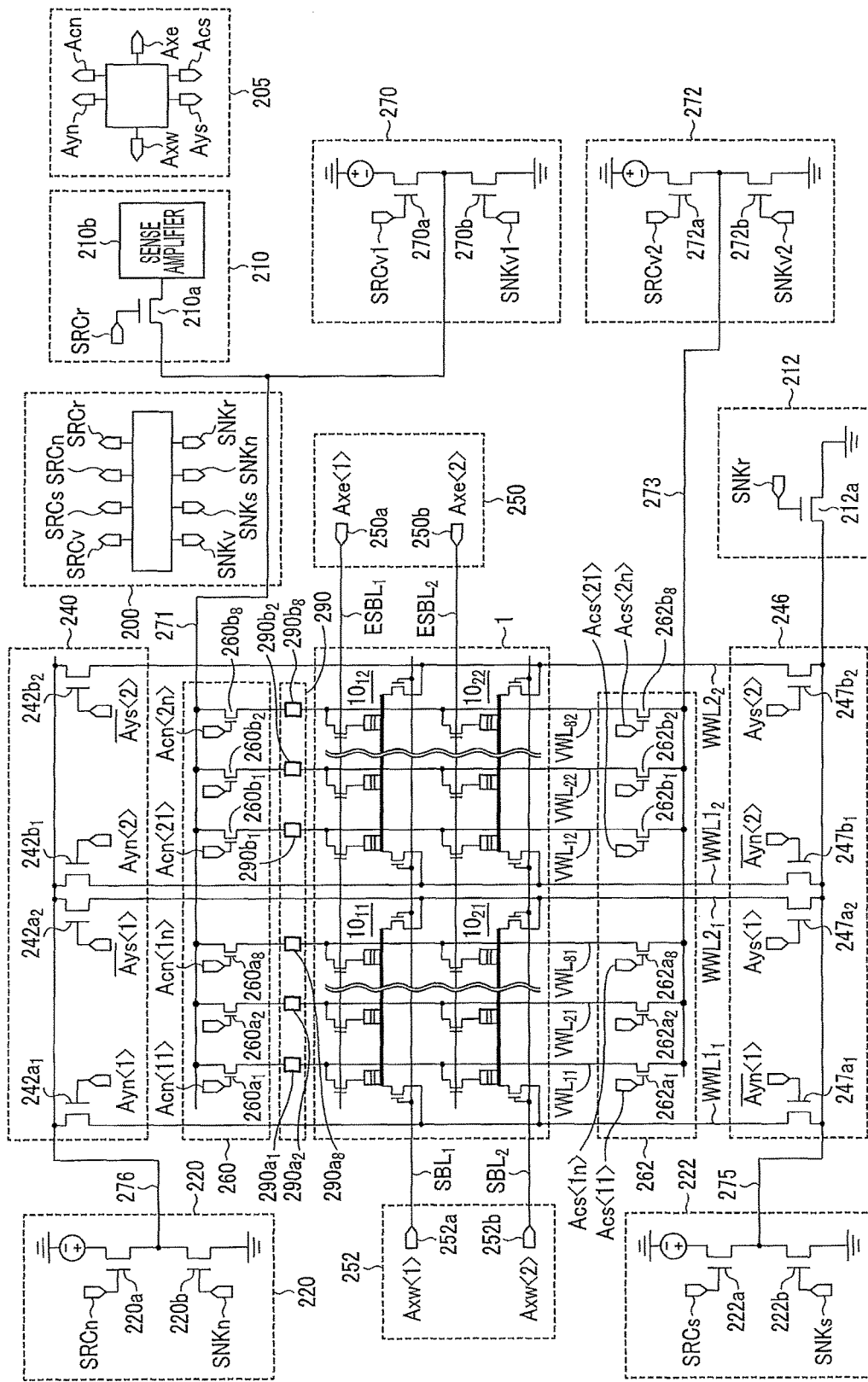
FIG. 11 is a circuit diagram showing a magnetic memory according to a sixth embodiment.

FIG. 11 shows a circuit diagram of a magnetic memory according to a sixth embodiment. The magnetic memory of the sixth embodiment includes the memory cell array 1 shown in FIG. 10, a control circuit 200, a decoder 205, read circuits 210 and 212, write circuits 220 and 222, word line select circuits 240 and 246, bit line select circuits 250 and 252, cell select circuits 260 and 262, potential application circuits 270 and 272, and a parasitic resistance compensation circuit 290.

The control circuit 200 outputs control signals SRCv, SRCs, SRCn, SRCr, SNKv, SNKs, SNKn, and SNKr. The decoder 205 generates address signals Axw, Axe, Ayn, Ays, Acn, and Acs.

The read circuit 210 includes a transistor 210a that operates in accordance with the control signal SRCr, and a sense amplifier 210b. The sense amplifier 210b is connected to a wiring line 271 via the transistor 210a. The read circuit 212 includes a transistor 212a that operates in accordance with the control signal SNKr. The source of the transistor 212a is grounded, and the drain is connected to a wiring line 275.

The write circuit 220 includes a transistor 220a that operates in accordance with the control signal SRCn, and a transistor 220b that operates in accordance with the control signal SNKn. The drain of the transistor 220a and the drain of the transistor 220b are connected to a wiring line 276, and the source of the transistor 220a and the source of the transistor 220b are grounded.

The write circuit 222 includes a transistor 222a that operates in accordance with the control signal SRCs, and a transistor 222b that operates in accordance with the control signal SNKs. The drain of the transistor 222a and the drain of the transistor 222b are connected to the wiring line 275, and the source of the transistor 222a and the source of the transistor 222b are grounded.

The word line select circuit 240 includes a transistor $242a_1$ that operates in accordance with an address signal Ayn<1>, a transistor $242a_2$ that operates in accordance with an address signal /Ays<1>, a transistor $242b_1$ that operates in accordance with an address signal Ayn<2>, and a transistor $242b_2$ that operates in accordance with an address signal /Ays<2>. It should be noted that the address signal /Ays<1> is an inverted signal of an address signal Ays<1>. Likewise, a symbol "/A" means an inverted signal of a signal A in the description below. The sources of the transistors $242a_1$, $242a_2$, $242b_1$, and $242b_2$ are connected to the wiring line 276. The drain of the transistor $242a_1$ is connected to a write word line $WWL1_1$, the drain of the transistor $242a_2$ is connected to a write word line $WWL1_2$, the drain of the transistor $242b_1$ is connected to a write word line $WWL2_1$, and the drain of the transistor $242b_2$ is connected to a write word line $WWL2_2$.

The word line select circuit 246 includes a transistor $247a_1$ that operates in accordance with an address signal /Ayn<1>, a transistor $247a_2$ that operates in accordance with the address signal Ays<1>, a transistor $247b_1$ that operates in accordance with an address signal /Ayn<2>, and a transistor $247b_2$ that operates in accordance with an address signal Ays<2>. The sources of the transistors $247a_1$, $247a_2$, $247b_1$, and $247b_2$ are connected to the wiring line 275. The drain of the transistor $247a_1$ is connected to the write word line $WWL1_1$, the drain of the transistor $247a_2$ is connected to the write word line $WWL1_2$, the drain of the transistor $247b_1$ is connected to the write word line $WWL2_1$, and the drain of the transistor $247b_2$ is connected to the write word line $WWL2_2$.

The bit line select circuit 250 includes a terminal 250a that receives an address signal Axe<1>, and a terminal 250b that receives an address signal Axe<2>. The bit line select circuit 252 includes a terminal 252a that receives an address signal Axw<1>, and a terminal 252b that receives an address signal Axw<2>.

The cell select circuit 260 includes transistors $260a_j$ (j=1, ..., 8) that operate in accordance with address signals Acn<1j>, and transistors $260b_k$ (k=1, ..., 8) that operate in accordance with address signals Acn<2k>.

The source of each transistor $260a_j$ (j=1, ..., 8) and the source of each transistor $260b_k$ (k=1, ..., 8) are connected to the wiring line 271. The drain of each transistor $260a_j$ (j=1, ..., 8) is connected to a potential application word line $VWL_{j1}$ via a compensation element $290a_j$ of the parasitic resistance compensation circuit 290, and the drain of each transistor $260b_k$ (k=1, ..., 8) is connected to a potential application word line $VWL_{k2}$ via a compensation element $290b_k$ of the parasitic resistance compensation circuit 290.

The cell select circuit 262 includes transistors $262a_j$ (j=1, ..., 8) that operate in accordance with address signals Acs<1j>, and transistors $262b_k$ (k=1, ..., 8) that operate in accordance with address signals Acs<2k>.

The source of each transistor $262a_j$ (j=1, ..., 8) is connected to the potential application word line $VWL_{j1}$, and the source of each transistor $262b_k$ (k=1, ..., 8) is connected to the potential application word line $VWL_{k2}$. The drain of each transistor $262a_j$ (j=1, ..., 8) and the drain of each transistor $262b_k$ (k=1, ..., 8) are connected to a wiring line 273.

The parasitic resistance compensation circuit 290 is a circuit for reducing the variation of the parasitic resistance of the nonmagnetic layer 12 due to differences in position among the MTJ elements shown in FIG. 7, or for compensating the resistance difference in the bidirectional case illustrated in FIG. 7. In the parasitic resistance compensation circuit 290, compensation elements $290a_1$ through $290a_8$ and $290b_1$ through $290b_8$ are formed with resistive elements. Therefore, in the sixth embodiment, reading is performed by applying a read current from an MTJ element to the nonmagnetic layer 12 and making the read current flow in two directions, as in the third or fourth embodiment. Although the parasitic resistance compensation circuit 290 is disposed between the cell select circuit 260 and the memory cell array 1 in the sixth embodiment, the parasitic resistance compensation circuit 290 may be disposed in the cell select circuit 260.

In the sixth embodiment designed as above, the same voltage adjustment as that in the first embodiment shown in FIG. 1 can be performed. As for the potentials to be applied at a time of writing, two kinds of potentials can be set: the potential application circuit 270 sets a potential $V_{BL1}$, and the potential application circuit 272 sets a potential $V_{BL2}$. As these potential application circuits are added, the set voltages can be adjusted as shown in FIG. 5.

(Write Operation)

Next, a write operation is described. In the description below, an example case where writing is performed on the memory cell $10_{12}$ is explained. When information (0, 1, 1, 0, 0, 0, 1, 0) is written into the MTJ elements $20_1$ through $20_8$ of the memory cell $10_{12}$, the MTJ elements $20_1$ through $20_8$ of the memory cell $10_{12}$ are first initialized, or data "0" is written into the MTJ elements $20_1$ through $20_8$ of the memory cell $10_{12}$ in a first step. This initialization activates (turns on) the address signals Acn<11> through Acn<14>, using the cell select circuit 260. The initialization also turns on the address signals Acs<15> through Acs<18>, using the cell select circuit 262. In this state, the address signal Axe<1> is turned on by the bit line select circuit 250, so that the MTJ elements $20_1$ through $20_4$ are connected to the potential application circuit 270, and the MTJ elements $20_5$ through $20_8$ are connected to the potential application circuit 272. In this manner, the necessary voltages are applied to the memory cell $10_{12}$. Further, the write word line $WWL1_1$ and the write word line $WWL1_2$ are connected to the write circuit 220 and the write circuit 222, respectively, by the word line select circuit 240 and the word line select circuit 246. In this state, the address signal Axw<1> is turned on by the bit line select circuit 252, a desired current is applied to the nonmagnetic layer 12 of the memory cell $10_{12}$, and data "0" is written into the MTJ elements $20_1$ through $20_8$.

In a second step, to perform writing of the information (0, 1, 1, 0, 0, 0, 1, 0), data "1" is written into the MTJ element $20_2$, the MTJ element $20_3$, and the MTJ element $20_7$. To write data "1", the write current applied to the nonmagnetic layer 12 is made to flow in the opposite direction (reverse direction) from that in the case where data "0" is written. Furthermore, the direction in which the voltage drops is also reversed, the potential application circuits 270 and 272 to be connected to the MTJ elements need to be reversed from those in the first step. However, data "1" is not written into the MTJ element $20_1$, the MTJ element $20_4$, the MTJ element $20_5$, the MTJ element $20_6$, and the MTJ element $20_8$.

Therefore, in the second step, the MTJ element $20_1$, the MTJ element $20_4$, the MTJ element $20_5$, the MTJ element $20_6$, and the MTJ element $20_8$ are not connected to the potential application circuits 270 and 272.

In a case where potential application circuits of the opposite polarities are provided, each MTJ element is connected to the potential application circuit of the opposite polarity. Specifically, the address signal Acn<17> is turned on with the cell select circuit 260, and the address signal Acs<12> and the address signal Acs<13> are turned on with the cell select circuit 262. In this state, the address signal Axe<1> is turned on with the bit line select circuit 250, so that the desired potentials are applied to the MTJ element $20_2$, the MTJ element $20_3$, and the MTJ element $20_7$. Further, the write word line $WWL1_1$ and the write word line $WWL1_2$ are connected to the write circuit 220 and the write circuit 222, respectively, with the word line select circuit 240 and the word line select circuit 246. In this state, the address signal Axw<1> is turned on by the bit line select circuit 252, a write current in the opposite direction from that in the first step is applied to the nonmagnetic layer 12 of the memory cell $10_{12}$, and data "1" is written into the MTJ element $20_2$, the MTJ element $20_3$, and the MTJ element $20_7$, to which the potentials have been applied.

(Read Operation)

To perform reading from a memory cell, a read current is applied to an MTJ element, and the resistance of the MTJ element is determined to be data "0" or data "1" with the sense amplifier 210b. For example, in a case where reading from the MTJ element $20_1$ of the memory cell $10_{11}$ is performed, address signals Acn<11>, Axw<1>, /Ayn<1>, and Ays<1> are turned on, and the read current is made to flow in the path from the read circuit 210 to the read circuit 212 via the MTJ element $20_1$, and is sensed by the sense amplifier 210b. As both the address signals /Ayn<1> and Ays<1> are turned on, the current that has passed through the MTJ element $20_1$ is applied to both side of the nonmagnetic layer 12, and the variation of the parasitic resistance of the nonmagnetic layer 12 can be reduced as shown in FIG. 7.

Figure 12:
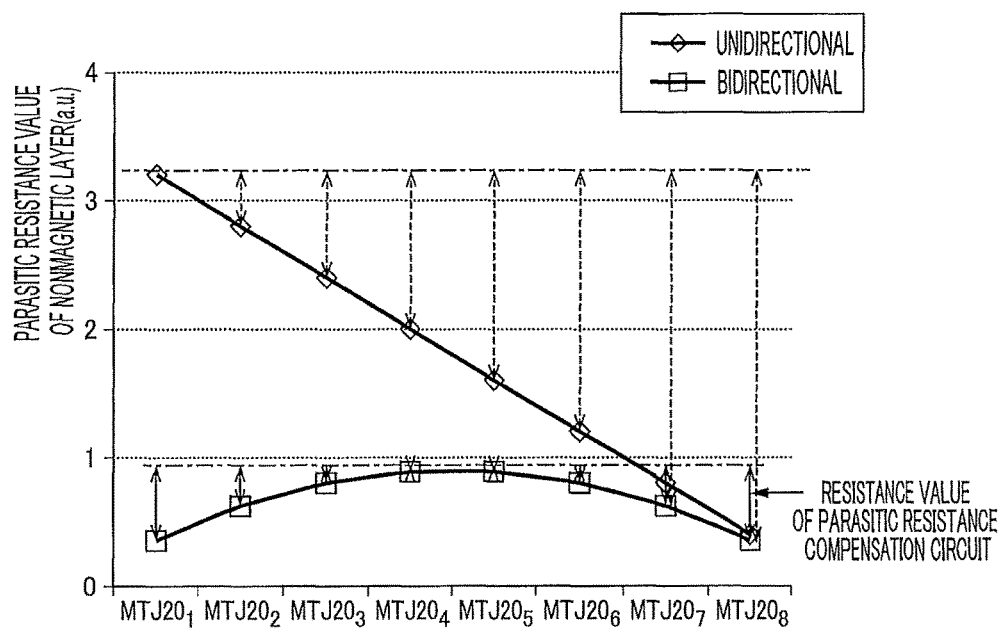
FIG. 12 is a graph showing examples of the resistance values of the resistive elements of a parasitic resistance compensation circuit.

The resistances of the respective resistive elements of the parasitic resistance compensation circuit 290 are set at the values indicated by the arrows with solid lines shown in FIG. 12. That is, the resistances of the respective resistive elements are set so that the variation of the parasitic resistance of the nonmagnetic layer 12 due to the differences in position among the MTJ elements becomes smaller. In a case where reading from an MTJ element is performed by making the read current flow in one direction in the nonmagnetic layer 12, the resistance values of the resistive elements of the parasitic resistance compensation circuit 90 are set at the values indicated by the arrows with dashed lines shown in FIG. 12.

The address signals Ayn, /Ayn, Ays, and /Ays activate the corresponding transistors when writing or reading is performed on the connected MTJ elements. If one of the address signals Ayn and /Ayn is on at this point, the other one is turned off. The same applies to the address signal Ays. When neither writing nor reading is performed on the connected MTJ elements, the address signals Ayn, /Ayn, Ays, and /Ays turn off the transistors $242a_1$, $242a_2$, $242b_1$, $242b_2$, $247a_1$, $247a_2$, $247b_1$, and $247b_2$.

As described above, like the first embodiment, the sixth embodiment also provides a magnetic memory that can reduce resistance variation during operation due to differences in position among MTJ elements arranged on a nonmagnetic layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first terminal and a second terminal;
a conductive layer including first to fourth regions, the second region being between the first region and the fourth region, the third region being between the second region and the fourth region, the first region being electrically connected to the first terminal, and the fourth region being electrically connected to the second terminal;
a first magnetoresistive element disposed corresponding to the second region, the first magnetoresistive element including: a first magnetic layer; a second magnetic layer between the second region and the first magnetic layer; a first nonmagnetic layer between the first magnetic layer and the second magnetic layer; and a third terminal electrically connected to the first magnetic layer;
a second magnetoresistive element disposed corresponding to the third region, the second magnetoresistive element including: a third magnetic layer; a fourth magnetic layer between the third region and the third magnetic layer; a second nonmagnetic layer between the third magnetic layer and the fourth magnetic layer; and a fourth terminal electrically connected to the third magnetic layer; and
a circuit configured to apply a write current between the first terminal and the second terminal and apply a first and second potentials to the third and fourth terminals respectively to write the first and second magnetoresistive elements, the first and second potentials being different from each other.

2. The memory according to claim 1, wherein the circuit applies the write current from the first terminal to the second terminal, and apply the first potential to the third terminal and the second potential to the fourth terminal, the second potential being lower than the first potential.

3. The memory according to claim 1, wherein the circuit applies the first and second potentials, to make an absolute value of a difference between a first difference and a second difference smaller, the first difference being a difference between the first potential and a potential of the second region, and the second difference being a difference between the second potential and a potential of the third region.

4. The memory according to claim 1, wherein the circuit applies the first and second potentials, to make a difference between the first potential and a potential of the second region substantially equal to a difference between the second potential and a potential of the third region.

5. A magnetic memory comprising:
a first terminal and a second terminal;
a conductive layer including first to fourth regions, the second region being between the first region and the fourth region, the third region being between the second region and the fourth region, the first region being electrically connected to the first terminal, and the fourth region being electrically connected to the second terminal;
a first magnetoresistive element disposed corresponding to the second region, the first magnetoresistive element including: a first magnetic layer; a second magnetic layer between the second region and the first magnetic layer; a first nonmagnetic layer between the first magnetic layer and the second magnetic layer; and a third terminal electrically connected to the first magnetic layer;

a second magnetoresistive element disposed corresponding to the third region, the second magnetoresistive element including: a third magnetic layer; a fourth magnetic layer between the third region and the third magnetic layer; a second nonmagnetic layer between the third magnetic layer and the fourth magnetic layer; and a fourth terminal electrically connected to the third magnetic layer; and a circuit configured to apply a write current between the first terminal and the second terminal and apply potentials to the third and fourth terminals to write the first and second magnetoresistive elements, the circuit applying a first potential to the third terminal and a second potential lower than the first potential to the fourth terminal and applying the first write current from the first terminal to the second terminal, and the circuit applying a second write current from the second terminal to the first terminal and applying a third potential to the terminal of one of the first and second magnetoresistive elements in which data is to be written.

6. The memory according to claim 5, wherein the circuit applies the first and second potentials, to make a difference between the first potential and a potential of the second region substantially equal to a difference between the second potential and a potential of the third region.

7. A magnetic memory comprising:
a first terminal and a second terminal;
a conductive layer including first to fifth regions, the second region being between the first region and the fifth region, the third region being between the second region and the fifth region, the fourth region being between the third region and the fifth region, the first region being electrically connected to the first terminal, and the fifth region being electrically connected to the second terminal;
a first magnetoresistive element disposed corresponding to the second region, the first magnetoresistive element including: a first magnetic layer; a second magnetic layer between the second region and the first magnetic layer; a first nonmagnetic layer between the first magnetic layer and the second magnetic layer; and a third terminal electrically connected to the first magnetic layer;
a second magnetoresistive element disposed corresponding to the fourth region, the second magnetoresistive element including: a third magnetic layer; a fourth magnetic layer between the fourth region and the third magnetic layer; a second nonmagnetic layer between the third magnetic layer and the fourth magnetic layer; and a fourth terminal electrically connected to the third magnetic layer;
a third magnetoresistive element disposed corresponding to the third region, the third magnetoresistive element including: a fifth magnetic layer; a sixth magnetic layer between the third region and the fifth magnetic layer; a third nonmagnetic layer between the fifth magnetic layer and the sixth magnetic layer; and a fifth terminal electrically connected to the fifth magnetic layer;
a resistive layer arranged parallel to the conductive layer, the resistive layer having substantially the same resistance as the conductive layer, the resistive layer having a sixth terminal and a seventh terminal, the sixth terminal being electrically connected to the first terminal, the seventh terminal being electrically connected to the second terminal;
a first electrode, a second electrode, and a third electrode arranged in positions on the resistive layer, the positions of the first electrode, the second electrode, and the third electrode corresponding to positions of the third magnetoresistive element, the second magnetoresistive element, and the first magnetoresistive element, respectively;
a first circuit configured to apply a read current between the terminal of one of the first through third magnetoresistive elements and the first and second terminals, when reading from the one of the first through third magnetoresistive elements is performed; and
a second circuit including: first through third input terminals connected to the first through third electrodes, respectively, and an output terminal, the second circuit selecting one of the first through third input terminals to be electrically connected to the output terminal in accordance with a control signal.

8. The memory according to claim 7, further comprising:
a first transistor, one of a source and a drain of the first transistor being electrically connected to the first terminal;
a second transistor, one of a source and a drain of the second transistor being electrically connected to the second terminal;
a first wiring, the other one of the source and the drain of the first transistor being electrically connected to the first wiring; and
a second wiring, the other one of the source and the drain of the second transistor being electrically connected to the second wiring,
wherein the first circuit is electrically connected to the first and second wirings.

9. A magnetic memory comprising:
a first terminal and a second terminal;
a conductive layer including first to fifth regions, the second region being between the first region and the fifth region, the third region being between the second region and the fifth region, the fourth region being between the third region and the fifth region, the first region being electrically connected to the first terminal, and the fifth region being electrically connected to the second terminal;
a first magnetoresistive element disposed corresponding to the second region, the first magnetoresistive element including: a first magnetic layer; a second magnetic layer between the second region and the first magnetic layer; a first nonmagnetic layer between the first magnetic layer and the second magnetic layer; and a third terminal electrically connected to the first magnetic layer;
a second magnetoresistive element disposed corresponding to the fourth region, the second magnetoresistive element including: a third magnetic layer; a fourth magnetic layer between the fourth region and the third magnetic layer; a second nonmagnetic layer between the third magnetic layer and the fourth magnetic layer; and a fourth terminal electrically connected to the third magnetic layer;
a third magnetoresistive element disposed corresponding to the third region, the third magnetoresistive element including: a fifth magnetic layer; a sixth magnetic layer between the third region and the fifth magnetic layer; a third nonmagnetic layer between the fifth magnetic layer and the sixth magnetic layer; and a fifth terminal electrically connected to the fifth magnetic layer;
a circuit configured to apply a read current between the terminal of one of the first through third magnetoresistive elements and the first and second terminals, when reading from the one of the first through third magnetoresistive elements is performed; and a compensation circuit including first through third resistive elements electrically connected to the third through fifth terminals, resistances of the first through third resistive elements being set to reduce resistance variation in read paths of the first through third magnetoresistive elements, the resistance variation being caused by differences among the read paths.

* * * * *